United States Patent
De Jong et al.

(10) Patent No.: US 6,297,643 B2
(45) Date of Patent: *Oct. 2, 2001

(54) CONNECTION TEST METHOD

(75) Inventors: Franciscus G. M. De Jong; Mathias N. M. Muris; Rodger F. Schuttert; Johannes De Wilde, all of Eindhoven (NL)

(73) Assignee: U.S. Philips Corporation, New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,012

(22) Filed: Feb. 1, 1999

(30) Foreign Application Priority Data

Feb. 5, 1998 (EP) .................................................. 98200338

(51) Int. Cl.⁷ .......................... H01H 31/02; G01R 19/00; G01R 27/28; G01R 27/26
(52) U.S. Cl. ....................... 324/537; 324/76.11; 324/654; 324/658; 714/727
(58) Field of Search ............................... 324/537, 76.11, 324/76.17, 76.29, 533, 519, 523, 522, 531, 527, 528, 602, 99 D, 658, 712, 654, 765, 768; 702/117; 714/726, 727, 729

(56) References Cited

U.S. PATENT DOCUMENTS

| 2,707,267 | * | 4/1955 | Gavin | .................................. 324/533 |
| 4,166,974 | * | 9/1979 | Vermeers | .............................. 324/679 |
| 5,389,882 | * | 2/1995 | I'Anson et al. | ...................... 324/522 |
| 5,539,338 | * | 7/1996 | Moreland | ............................... 327/19 |
| 5,563,523 | * | 10/1996 | Wiemers | ............................... 324/763 |
| 5,577,052 | * | 11/1996 | Morris | .................................. 714/733 |
| 5,596,587 | * | 1/1997 | Douglas et al. | ...................... 714/739 |
| 5,610,826 | * | 3/1997 | Whetsel | .............................. 702/117 |
| 5,696,451 | * | 12/1997 | Keirn et al. | ........................... 324/537 |
| 5,781,559 | * | 7/1998 | Muris et al. | ........................... 714/726 |

FOREIGN PATENT DOCUMENTS

| 3406958 | 9/1985 | (NL) . |
| WO9714974 | 4/1997 | (WO) ............................ G01R/31/28 |

* cited by examiner

Primary Examiner—Safet Metjahic
Assistant Examiner—Anjan K. Deb

(57) ABSTRACT

The invention relates to a method of testing interconnections in integrated circuit (IC) assemblies. Hereto, a test signal is applied to an IC pin (110) providing an input terminal to the interconnection. In known methods, such as the boundary-scan method, a response signal is measured on an output terminal of the interconnection, provided by a further IC pin. According to the invention, however, a response signal is evaluated which is generated on the same terminal (110) as to which the test signal is applied. This has the advantage that the method of the invention can be applied when only one end of the interconnect to be tested can be supplied with appropriate test hardware. The method is particularly suited for testing a capacitance (195) between an IC pin (110) and a supply line, e.g. a ground line.

11 Claims, 1 Drawing Sheet

CONNECTION TEST METHOD

The invention relates to a method of testing a signal path in a circuit, the method comprising the step of applying a test signal to a terminal of the signal path. The invention further relates to a testable circuit and an integrated circuit for implementing such a method.

For testing signal paths connected to integrated circuits (ICs) in an IC assembly such as a printed circuit board or a multi-chip module, in-circuit techniques have been widely used. Due to the trend of miniaturization of electronic components this approach is getting less feasible. A preferred approach is to use special ICs comprising dedicated test hardware for in a test mode testing the signal paths. For digital signal paths, providing connection between digital sections of ICs, a particularly successful example of such an approach is the boundary-scan approach, as defined by the IEEE Std. 1149.1. The boundary-scan approach amounts to driving a first IC pin at one end of such a signal path to a high or a low level and sensing a second IC pin at an other end of the signal path. As in digital assemblies the digital signal paths usually are plain wires, and the signal levels are DC voltage levels, the signals at both ends should be DC voltage levels. To facilitate the propagation of input signals to interior nodes of the IC, and the propagation of output signals from interior nodes of the IC, a series of boundary-scan cells are used. The input test pattern is provided to each cell by serial shifting from an input pin that contains the appropriate test pattern to the series of boundary scan cells. The input test pattern, which is now contained in the boundary scan cells, is then applied to the interior input nodes. The resultant states of select interior nodes, produced by the application of the test pattern, are provided to the scan cells. The contents of these scan cells are serial shifted to an output pin of the IC. The series of DC voltage levels from the output pin are compared to an expected output pattern, based on the input test pattern. In this way, faults in the signal path, such as open and short connections, can be easily detected.

Analog signal paths, however, often comprise analog circuits such as filters. The boundary-scan approach can not be used for testing such signal paths, as driving an input of, for example, a high-pass filter with a DC voltage level will not necessarily result in the same voltage at the time of capture on an output pin thereof. A method for testing such signal paths is described in WO 97/14974 (corresponding to U.S. patent application Ser. No. 08/734,009). According to the known method, a time-varying test signal is generated at an input of the signal path, whereas at a test point that is coupled to an output of the signal path, a response signal is detected. Faults in the signal path can thus be detected on the basis of the temporal behaviour of the response signal.

It is an object of the invention to provide a method as specified in the preamble, which can be more generally applied than the known method. To this end, a method according to the invention is characterized in that the method further comprises the step of evaluating a response signal on the same terminal as to which the test signal is applied. Thus, use is made of the fact that applying a test signal to the terminal of a signal path produces at the same terminal an effect characterizing that signal path. This effect, having the form of a response signal, can be evaluated.

The invention is particularly useful when only one terminal of the signal path to be tested is available for testing. This is the case, for example, with a widely used element as a decoupling capacitance between an IC pin and a supply line, e.g. a ground line. When testing for the presence of such a capacitance from within the IC, the capacitance can only be accessed via the IC pin. The known method can not be used for testing such an analog signal path, as it requires both an input and an output of the signal path. A further example is the case in which the signal path to be tested at one of its ends is connected to an IC or other device that is not equipped with test hardware in conformity with the boundary-scan approach or with the above known method. In both cases the signal path can be tested with the method of the invention.

The response signal could completely or partially coincide with the test signal. Alternatively, the test signal and the response signal are distinct signals. This is the case, for example, when the test signal is applied in a first phase for pumping energy into the signal path, at the same time the energy being stored in reactive components of the signal path such as capacitances and inductances, and in a subsequent second phase the energy is released via the terminal, thereby forming the response signal. Anyhow, only one terminal of the signal path to be tested has to be accessible.

The outcome of the evaluation, and therefore of the test, could be a binary value indicating whether or not the signal path produced a response signal with an expected behaviour. Hereto, level detection methods could be used, detecting, for example, whether or not the response signal within some time interval reaches a certain level or whether or not the response signal at a certain moment still has a certain level. Alternatively, the outcome of the evaluation is a more comprehensive qualification of the signal path in terms of circuit parameters such as resistance, capacitance, attained voltage level, etc.

In some cases, it is not practical to use the aforementioned level detection method approach and detect whether the response signal reaches a certain level. When the response signal is weak, for example, this would require a rather precise detection method. In an embodiment of the method according to the invention the evaluating step comprises deriving a secondary signal that comprises an integrated version of the response signal and detecting whether the secondary signal reaches a certain level. As in a value of the secondary signal at a certain moment the characteristics of the signal path have accumulated, this signal can be a more reliable indication of the signal path and therefore be a more suitable signal for use with a level detection method. This aspect of the invention is particularly useful for small, diminishing response signals, such as a signal produced by a discharging capacitance. The integration produces a secondary signal with a positive slope, the amplitude of the secondary signal being a measure of the capacitance. It is not required, however, that the secondary signal is exactly an integrated version of the response signal. It suffices that the value of the secondary signal at a certain moment is related to the values of the response signal within a preceding interval. Therefore, the secondary signal is said to comprise an integrated version of the response signal.

Advantageously, the method according to the invention is applied to testing a signal path in an IC assembly, in which case the above circuit is the IC assembly, the above signal path is external to the ICs thereof, and the above terminal is an IC pin.

These and other aspects of the invention will be apparent from and elucidated with reference to the embodiments described hereinafter.

Figure 1:
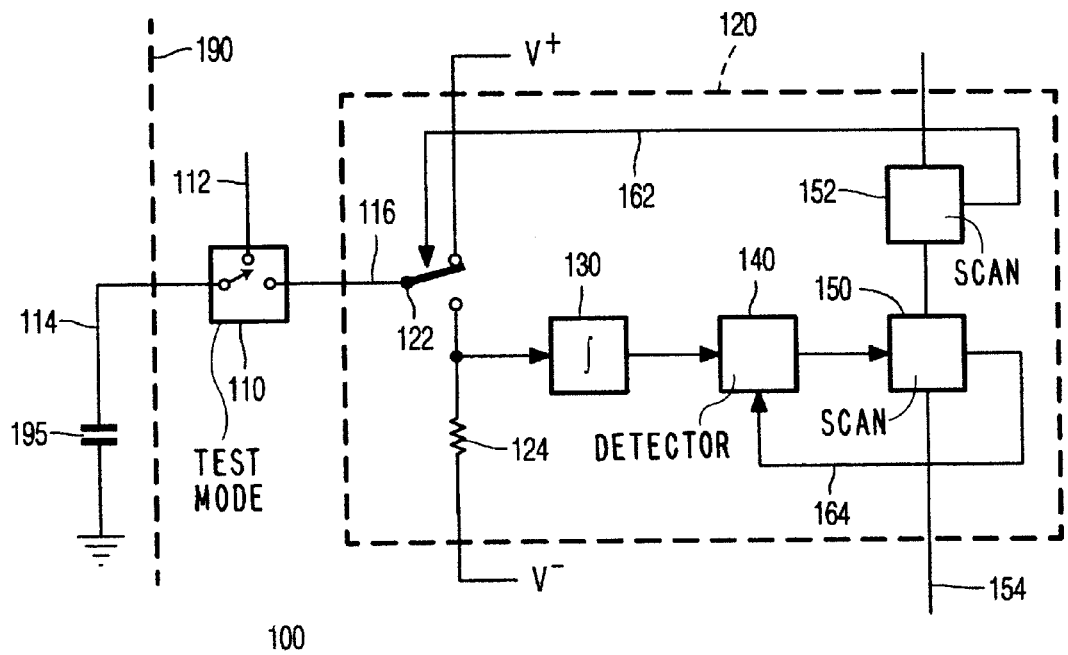
FIG. 1 shows a schematic view of a circuit according to the invention.

FIG. 1 shows a schematic view of a circuit 100 according to the invention. The circuit 100 has a terminal 110 that in a normal mode of the circuit 100 connects a signal path 112 to a signal path 114. The signal path 114 connects the terminal 110 to ground via a discrete capacitance 195. The terminal 110 is further connected to a test circuit 120 via a signal path 116 for in a test mode testing whether the signal path 114 is established, i.e. if the capacitance 195 is present.

The test circuit is composed of a switching mechanism 122, an impedance 124 having mainly a resistive character, an integrator 130 and a detector 140. Furthermore, two digital boundary-scan cells 150, 152 are included for monitoring and control.

In a first mode of the test circuit, the switching mechanism 122 connects the terminal 110 to V+, thereby feeding a test signal to the terminal that charges the capacitance 195. Subsequently, in a second mode the switching mechanism 122 connects the terminal 110 to V− via the impedance 124, thereby discharging the capacitance 195 which establishes a response signal on the terminal 110. The response signal has the form of a falling RC curve, the steepness of which being an indication of the value of the capacitance. The response signal is fed to the integrator 130, which provides the detector 140 with a secondary signal that comprises an integrated version of the response signal. That secondary signal will have a maximum value that is determined by the shape of the response signal. If this maximum value exceeds a threshold of the detector, an output of the detector will change. The minimum value of the capacitance 195 that can still be detected depends on the value of the impedance 124, the integrating performance of the integrator 130 and the threshold value of the detector 140.

Figure 2:
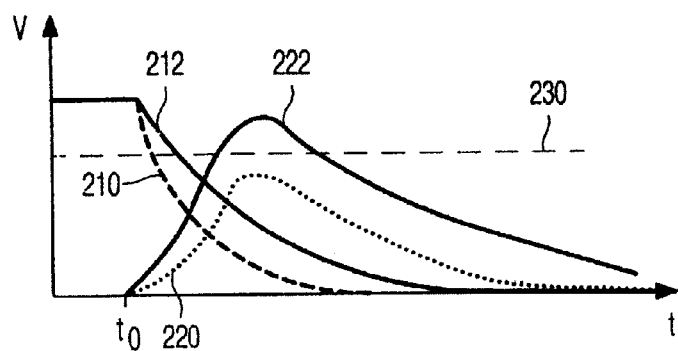
FIG. 2 shows some signals that occur in the circuit according to the invention.

In FIG. 2 curves 210, 220 represent a first response signal and a first secondary signal that occur in the circuit 100 in case of a particular, low value of the capacitance 195. Curves 212, 222 represent a second response signal and a second secondary signal in case of a particular, higher value of the capacitance 195. Furthermore, FIG. 2 shows the threshold of the detector 140 as a line 230. It will be clear that in the present case only the second secondary signal 222 will cause the output of the detector 140 to change.

It should be noted that if the secondary signals 220,222 were exact integrated versions of the corresponding response signals 210,212, the secondary signals 220,222 would be rising RC curves, not curves with declining slopes. It is assumed here, however, that the integrator 130 has a very simple implementation, in that it does not provide an exact integration, but rather an approximate integration. It should further be noted that V− and ground could in some circuits be one and the same. This would, however, not require modifications of the circuit or the test method.

The output of the detector is connected to an input of the boundary-scan cell 150. In this way, the result of the test can easily be made available through shifting. The test circuit in FIG. 1 further has control signals 162 and 164, that are generated by respective outputs of the boundary-scan cells 152 and 150. The control signal 162 controls the switching mechanism 122, whereas the control signal 164 resets the detector 140, to prepare it for detection of a pulse. The fact that the control signals 162 and 164 are generated by boundary-scan cells has the advantage that the test circuit can be easily controlled from the outside.

With the circuit of FIG. 1, manufacturing defects in the signal path 114, like a short-circuit between the terminal 110 and ground or an open circuit in the signal path 114, can be detected. In case of such defects, there will still be a small parasitic capacitance between the terminal 110 and ground. Therefore, the minimum value of the capacitance 195 that can still be detected with the test circuit 120 must be chosen to be at least the maximum possible value of a parasitic capacitance between the terminal 110 and ground.

In FIG. 1, the capacitance 195 is a discrete component. It will be clear that, alternatively, the capacitance 195 could represent a parasitic capacitance, whereas the test is aimed at detecting whether the parasitic capacitance exceeds a predetermined value or not. Such a test could be used for testing whether a plain wire is present between two nodes, e.g. two IC pins, as this will be reflected in the value of the parasitic capacitance. Of course, for such a test it is irrelevant whether the nodes at either side of the wire belong to analog or to digital circuits.

With minor modifications, the circuit 100 could test a whole range of signal paths that differ from the signal path 114, for example a signal path providing a connection via a capacitance to V+ instead of to ground. In the latter case, in the first mode the capacitance could be discharged and in the second mode, the capacitance could be recharged, thereby generating a response signal. Another testable signal path is for example a signal path providing a connection to ground via an inductance. In that case, a circuit according to the invention would, for example, in a first step energize the inductance and in a second step de-energize the inductance, the test circuit 120 being modified such that it can sense currents instead of voltages. With appropriate modifications, any kind of signal path connected to the terminal 110 could be tested. Impedance 124 can be chosen such that a significant response signal is generated on the terminal 110. For some signal paths, the impedance 124 can even be left out.

So far, testing resulted in a binary outcome, indicating whether a level had been detected in the secondary signal, or not. In the context of this text, testing a signal path also means characterizing the signal path by a full measurement. Hereto, the method discussed above could, for example, be executed repeatedly with a number of different impedances 124 or with a number of different thresholds of the detector 140. Each next execution could add a further bit to an n-bit characterization of the signal path 114, e.g. an n-bit value of the capacitance 195.

The circuit 100 is divided into two parts by a line 190. This serves to clarify a particularly important application of the invention, in which a part of the circuit 100 to the right of the line 190, is an IC, the terminal 110 being an IC pin, and a part of the circuit 100 to the left of the line 190, represents the environment of the IC. Particularly in this embodiment of the invention, it is advantageous to use one and the same test circuit 120 for a number of terminals, not just for the terminal 110. By sharing the test circuit among several IC pins, the amount of area taken up by the test hardware can be reduced. With appropriate channels, it could even be imagined that a single test circuit is used in combination with terminals of several distinct ICs, allowing a further reduction of required area.

Figure 3:
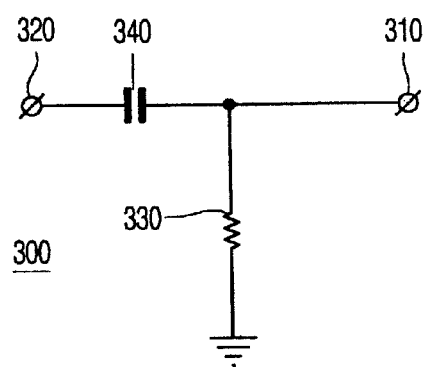
FIG. 3 shows an alternative signal path that can be tested according to the method of the invention.

FIG. 3 shows an alternative signal path that can be tested according to the method of the invention. The signal path runs from an input terminal 310 to an output terminal 320, the terminals 310, 320 being part of a high pass filter circuit 300 comprising a resistance 330 and a capacitance 340. For explaining how the method of the invention could be used for testing such a signal path, reference is made to FIG. 1, in which the circuit 300 is assumed to replace the signal path 110. Hereto, the input terminal 310 is connected to terminal 110 and the output terminal 320 is connected to an input of a further circuit, that has not been provided with hardware for executing the above-mentioned known method, which will be the case for most commercial ICs. Therefore, the known method cannot be used for testing this signal path.

The above embodiment of the method of the invention, however, can be completely followed for this kind of signal paths as well, provided that the output terminal 320 is kept at a level which is, at least approximately DC, such as V+ or V−. By operating the switching mechanism 122 in the way described above, again a response signal in the form of a falling RC curve is obtained, its steepness comprising information on the value, c.q. presence of the capacitance. The impedance 124 might not be required in view of the already present resistance 330.

Although the invention has been explained primarily in the context of signal paths on IC assemblies, the invention can be applied to testing any kind of signal paths in a circuit.

It should be noted that the above-mentioned embodiments illustrate rather than limit the invention and that those skilled in the art will be able to design many alternative embodiments without departing from the scope of the appended claims. In the claims, any reference signs placed between parentheses shall not be construed as limiting the claim. The invention can be implemented by means of hardware comprising several distinct elements, and by means of a suitably programmed computer. In the device claim enumerating several means, several of these means can be embodied by one and the same item of hardware.

What is claimed is:

1. A method of testing a signal path in a circuit, the method comprising:

applying a test signal to a terminal of the signal path, and receiving a response signal from the terminal, comparing the response signal to a predefined parameter to produce a binary signal having a state that is indicative of a fault on the signal line, providing the binary signal to a boundary-scan cell, to facilitate a detection of the fault on the signal path by shifting the binary signal to an external node via the boundary-scan cell, wherein
the response signal is dependent upon at least one of a capacitive and an inductive characteristic associated with the signal path.

2. The method as claimed in claim 1, wherein comparing the response signal to the predefined parameter includes:

deriving a secondary signal that corresponds to an integral of the response signal, and comparing the secondary signal to a threshold value corresponding to the predefined parameter.

3. A testable circuit comprising:

a signal path, a test circuit for connection to a terminal of the signal path, the test circuit including:

a generator that is configured to apply a test signal to the terminal, and an evaluator that is configured to evaluate a response signal on the terminal to facilitate a detection of a fault on the signal path by comparing the response signal to a predefined parameter to produce a binary signal that is indicative of the fault, and, a scan device that is configured to propagate the binary signal to an external pin of the testable circuit.

4. The testable circuit of claim 3, wherein
the response signal is dependent upon at least one of a capacitance and an inductance of the signal path.

5. An integrated circuit comprising:

a terminal for connection to an external circuit, a test circuit for connection to the terminal, the test circuit including:

a generator that is configured to apply a test signal to the terminal, and an evaluator that is configured to evaluate a response signal on the terminal to facilitate a detection of a fault on the external circuit by comparing the response signal to a predefined parameter to produce a binary signal that is indicative of the fault, and, a scan device that is configured to propagate the binary signal to an other terminal of the integrated circuit.

6. The integrated circuit as claimed in claim 5, wherein the test circuit comprises:

a first mode in which the test signal is applied to the terminal by the generator, a second mode in which the response signal on the terminal is evaluated by the evaluator, and a controller that is configured to switch between the first and second mode.

7. The integrated circuit as claimed in claim 5, wherein the test circuit further comprises a detector circuit for comparing a level in an internal signal of the test circuit to a threshold value.

8. The integrated circuit as claimed in claim 5, wherein the test circuit further comprises:

an integrator circuit for deriving a secondary signal that corresponds to an integral of the of the response signal, and a detector circuit for comparing the secondary signal to a threshold value.

9. The integrated circuit as claimed in claim 5, wherein an output of the test circuit is connected to an input of a boundary-scan cell.

10. The integrated circuit as claimed in claim 5, wherein the controller includes an output of a boundary-scan cell.

11. The integrated circuit of claim 5, wherein
the response signal is dependent upon at least one of a capacitance and an inductance of the signal path.

* * * * *